United States Patent
Bodke et al.

(10) Patent No.: US 9,455,393 B1
(45) Date of Patent: Sep. 27, 2016

(54) LOW TEMPERATURE DEPOSITION OF LOW LOSS DIELECTRIC LAYERS IN SUPERCONDUCTING CIRCUITS

(71) Applicant: Intermolecular, Inc., San Jose, CA (US)

(72) Inventors: Ashish Bodke, San Jose, CA (US); Frank Greer, Pasadena, CA (US); Mark Clark, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 6 days.

(21) Appl. No.: 14/981,163

(22) Filed: Dec. 28, 2015

(51) Int. Cl.
  *H01L 29/06* (2006.01)
  *H01L 29/08* (2006.01)
  *H01L 39/24* (2006.01)
  *H01L 39/02* (2006.01)

(52) U.S. Cl.
  CPC ......... *H01L 39/2493* (2013.01); *H01L 39/025* (2013.01)

(58) Field of Classification Search
  CPC .................. H01L 39/2493; H01L 39/025
  USPC .......................................... 257/35
  See application file for complete search history.

(56) References Cited

U.S. PATENT DOCUMENTS

| | | | | |
|---|---|---|---|---|
| 4,220,959 A | * | 9/1980 | Kroger | H01L 39/223 257/32 |
| 2005/0107261 A1 | * | 5/2005 | Cantor | G01R 33/0052 505/100 |

* cited by examiner

Primary Examiner — Tu-Tu Ho

(57) ABSTRACT

Provided are superconducting circuits and method of forming thereof. A superconducting circuit may include a low loss dielectric (LLD) layer formed from one or both of polycrystalline silicon or polycrystalline germanium. The LLD layer may be formed at a low temperature (e.g., less than about 525° C.) using chemical vapor deposition (CVD). Addition of germanium may help to lower the deposition temperature and improve crystallinity of the resulting layer. The LLD layer is formed without adding silicides at the interface of the LLD layer and metal electrode. In some embodiments, an initial layer (e.g., a seed layer or a protective layer) may be formed on a metal electrode prior to forming the LLD layer. For example, the initial layer may include one of zinc sulfide, polycrystalline germanium, or polycrystalline silicon. The initial layer may be deposited at a low pressure (e.g., less than 10 Torr) to ensure higher levels of crystallinity.

15 Claims, 3 Drawing Sheets

LOW TEMPERATURE DEPOSITION OF LOW LOSS DIELECTRIC LAYERS IN SUPERCONDUCTING CIRCUITS

BACKGROUND

When a silicon containing structure is formed over a metal structure, a barrier layer is often used to prevent silicide formation at the interface of the silicon containing structure and the metal structure. For example, a barrier layer may be used when a silicon-containing low loss dielectric (LLD) layer, such as an amorphous silicon or silicon oxide, is formed over a metal electrode in a superconducting circuit. Without a barrier layer, there is a direct contact between metal and silicon atoms and silicides can start forming when the temperature exceeds 500° C. for most common metals. Formation of silicides may be undesirable because it leads to poor loss in semiconductor circuits, for example. While forming barrier layers adds to processing time and costs and may be not possible in some application, lowering deposition temperatures is generally not possible for most conventional silicon precursors, such as monosilane.

SUMMARY

Provided are superconducting circuits and method of forming thereof. A superconducting circuit may include a LLD layer formed from one or both of polycrystalline silicon and polycrystalline germanium. The LLD layer may be formed at a low temperature (e.g., less than about 525° C.) using chemical vapor deposition (CVD). Addition of germanium may help to lower the deposition temperature and improve crystallinity of the resulting layer. The LLD layer is formed without forming silicides at the interface of the LLD layer and metal layer, e.g., a metal electrode. In some embodiments, an initial layer (e.g., a seed layer or a protective layer) may be formed on a metal electrode prior to forming the LLD layer. For example, the initial layer may include one of zinc sulfide, polycrystalline germanium, or polycrystalline silicon. The initial layer may be deposited at a low pressure (e.g., less than 10 Torr) to ensure the higher levels of crystallinity. This high level of crystallinity serves as a template for later deposited layers, which may be deposited at a higher pressure thereby having a higher deposition rates.

In some embodiments, a method of forming a superconducting circuit involves providing a metal layer. The metal layer may be a part of Josephson junction, for example. The method may continue with forming a LLD layer over the metal layer using, for example, CVD. The metal layer is kept at a temperature of less than about 525° C. while forming the LLD layer. The LLD layer includes at least one of polycrystalline silicon or polycrystalline germanium. More specifically, the LLD layer may include both polycrystalline silicon and polycrystalline germanium. The concentration of polycrystalline germanium in the LLD layer may be between about 5 atomic % and 50 atomic %. In the same of different examples, the concentration of polycrystalline germanium is the LLD layer is between about 10 atomic % and 25 atomic %. The LLD layer may consist essentially of polycrystalline silicon.

In some embodiments, forming the LLD layer is performed at least initially at a pressure of less than 10 Torr or even at a pressure of less than 1 Torr. For example, the pressure may be between about 0.1 Torr and 10 Torr or between about 0.1 Torr and 1 Torr. Using a low pressure during initial deposition of the LLD layer helps with forming a highly crystalline structure and serves as a template when, for example, a remainder of the LLD layer is formed at a higher pressure. For example, the pressure may be increased by between about 2 and 10 times between the initial deposition of the LLD layer and a subsequent deposition of that layer.

In some embodiments, the method involves forming a seed layer over the metal layer. The seed layer is formed prior to forming the LLD layer. The LLD layer is formed over and directly interfacing the seed layer. As such, the seed layer is disposed between the LLD layer and the metal layer and, in some embodiments, directly interfaces both the LLD layer and the metal layer. The seed layer may include one of ZnS, polycrystalline germanium, or polycrystalline silicon. The composition of the seed layer may be different from the composition of the LLD layer. The seed layer may be formed using different process conditions or has a different composition than the LLD layer.

In some embodiments, the interface between the LLD layer and the metal layer is substantially free from silicide. The metal layer may include niobium. In some embodiments, the LLD layer further comprises fluorine.

In some embodiments, the CVD used to form the LLD layer is plasma enhanced CVD (PECVD) or thermal CVD. Without being restricted to any particular theory, it is believed that PECVD may be performed at a lower temperature than other forms of CVD and may help to reduce and even completely eliminate formation of silicides at the interface of the metal layer and the LLD.

Provided is a superconducting circuit including a metal layer. The metal layer may be a part of Josephson junction, for example. The superconducting circuit also includes an LLD layer disposed over the metal layer. The LLD layer comprises poly-crystalline germanium. In some embodiments, the LLD layer also includes poly-crystalline silicon. The concentration of poly-crystalline germanium in the LLD layer may be between about 5 atomic % and 50 atomic % or, more specifically, between about 10 atomic % and 25 atomic %. In some embodiments, the interface between the LLD layer and the metal layer is substantially free from silicide.

These and other embodiments are described further below with reference to the figures.

DETAILED DESCRIPTION

Figure 1A:
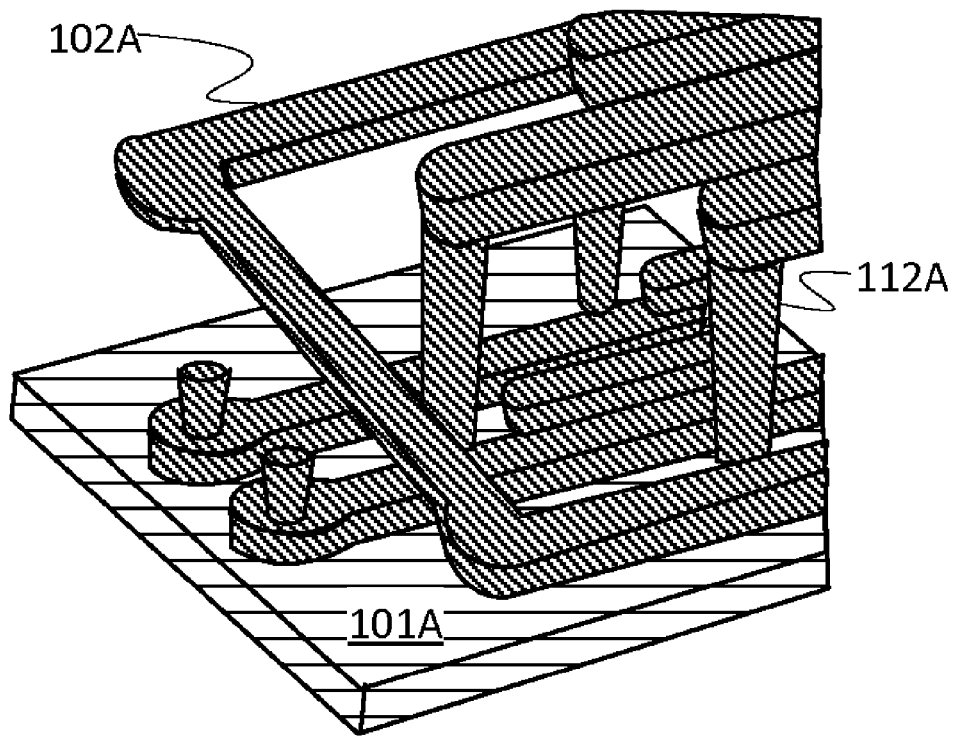
FIGS. 1A-1F are various schematic representations of superconducting circuits, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

Typically, integrated circuits combine multiple layers, including conductive, semi-conductive and/or insulating layers. For example, superconducting devices, such as Josephson junctions, include two metal electrodes separated by a thin insulating dielectric film. Furthermore, dielectric films may surround devices and may be referred to as LLDs or interlayer dielectrics. Crystalline silicon, polysilicon, and other like materials may be used for such dielectric.

Forming crystalline silicon at low temperatures (e.g., less than 525° C.) can be challenging and prone to various side reactions, such as silicide formation. Silicide formation is undesirable in many applications, such as superconducting circuits, because silicides may negatively change operating characteristics of these circuits.

Polysilicon is another suitable dielectric and is typically deposited using epitaxy CVD methods at high temperatures (e.g., over 550° C.). Alternatively, if deposition is performed at lower temperatures, subsequent annealing is required at temperatures higher than 800° C. These high-temperature deposition methods can be undesirable for many reasons, one of which is the formation of metal silicides as explained below.

CVD methods used for deposition of silicon-containing layers are based on supplying silicon-containing precursors into deposition chambers. The silicon-containing precursors either decompose or react with other gases at deposition surfaces maintained at elevated temperatures. Initially, a deposition surface may exposed to such precursors when, for example, a barrier layer is not used.

Considering that the silicon-containing precursor needs to be a highly reactive component and that the deposition needs to be performed at a higher temperature, the silicon-containing precursor may also react with the metal of the deposition surface thereby forming metal silicides. These metal silicides, when present at an interface of the silicon-containing layer and the metal layer, often decrease operating characteristics of the formed devices, such as superconducting devices. For example, the metal silicides can increase electrical resistivity of the superconducting devices.

To avoid formation of metal silicides at the interface of a silicon-containing layer and a metal layer, new methods of forming silicon containing layers over metal layers are described herein. In some embodiments, a CVD process, such as a Low-Pressure CVD (LPCVD), can be used for deposition of a polysilicon layer using silane, disilane, and/or higher order silane-based precursors. The LPCVD process may be run at sub-torr pressures, e.g., at less than 1 Torr and even less than 0.5 Torr, such as about 0.1 Torr. The temperature may be at less than 600° C. or even less than 550° C., such as about 500° C. In order to reduce crystallization temperatures, germanium is added to silicon. The amount of germanium may be less than the amount of silicon. Without being restricted to any particular theory, it is believed and has been experimentally proved that adding a few percent of germanium can significantly lower deposition temperatures while retaining polycrystalline morphology in the formed stricture. It is believed that germanium helps to retain crystallinity of the resulting layer.

Germanium can be introduced into a silicon containing layer during deposition of this layer, such as flowing a silicon containing precursor and a germanium containing precursor at the same time. For example, mono-silane ($SiH_4$) and germane ($GeH_4$) may be used for these purposes. The ratio or, more specifically, the flow-rate of the silane-containing precursor to the germanium containing precursor determines, at least in part, the composition of the deposited polysilicon layer.

In some embodiments, a polysilicon layer, which may be also referred herein to as a polycrystalline silicon layer or a polycrystalline silicon containing layer, is used in a superconducting circuit or device. One example of a polysilicon layer in a superconducting circuit is a LLD layer, which may include a combination of polycrystalline silicon and polycrystalline germanium. The concentration of polycrystalline germanium in the LLD layer may be between about 5 atomic % and 50 atomic % or, more specifically, between about 10 atomic % and 25 atomic %. The LLD layer may be formed at a low temperature (e.g., less than about 525° C.) and at a pressure of less than 10 Torr or even at a pressure of less than 1 Torr. The LLD layer may be formed using any suitable CVD method with addition of germanium. The LLD layer can be formed over a metal layer, such as a metal electrode of Josephson junction. The metal layer may include niobium, for example.

The use of germanium in the LLD layer appears to reduce and even completely eliminate formation of silicides at the interface of the LLD layer and the metal layer. Using a low pressure and a low temperature during at least the initial deposition of the LLD layer helps with forming a highly crystalline structure. In some embodiments, an initial layer (e.g., a seed layer or a protective layer) may be needed to form on the metal layer prior to forming the LLD layer. For example, the initial layer may include one of zinc sulfide, polycrystalline germanium, and polycrystalline silicon. The initial layer may be formed using different process conditions or has a different composition than the LLD layer. For example, the initial layer may be deposited at a low pressure (e.g., less than 10 Torr) to ensure the higher levels of crystallinity. This high level of crystallinity in the initial layer serves as a template for later deposited layers, which may be deposited at a higher pressure thereby having a higher deposition rates. Furthermore, the initial layer may be formed at low temperature to prevent formation of silicides at the interface.

In order to reduce crystallization temperatures, the deposition of the LLD layer may be carried out in a plasma environment, e.g., using plasma enhanced CVD. Plasma activates precursors (e.g., silicon containing precursors and germanium containing precursors) and reduced the energy barrier to form crystalline bonds in the deposited structure. It appears that plasma effects on crystallization dominate effects of forming silicide due to having activated species in the plasma environment. Furthermore, to prevent silicide formations at the interface of the LLD layer and the metal layer, plasma may not be used at least initially. The plasma may be introduced after the initial layer is formed.

In some embodiments, the CVD used to form the LLD layer is plasma enhanced CVD (PECVD) or thermal CVD. Without being restricted to any particular theory, it is believed that PECVD may be performed at a lower temperature than other forms of CVD and may help to reduce and even completely eliminate formation of silicides at the interface of the metal layer and the LLD.

Thus, the methods described herein allow for forming silicon-containing layers (e.g., LLD layers such as polycrystalline silicon layers) on metal layers of superconducting circuits without substantial formation of metal silicides inside the silicon-containing layers or at an interface of the polycrystalline silicon layer and a metal layer. For purposes of this disclosure, the term "substantially" used in the context of the lack of metal silicides within the LLD layer or the interface between the LLD layer and the metal layer shall mean that the level of metal silicide molecules in these layers does not negatively affect any operating characteristics of final superconducting circuit where the LLD layer and the metal layer are used. For example, the term "substantially," in this context, can mean that there are no more than 10% of metal silicide molecules in the LLD layer or within the interface between the LLD layer and the metal layer.

Examples of Superconducting Circuits

Figure 1B:
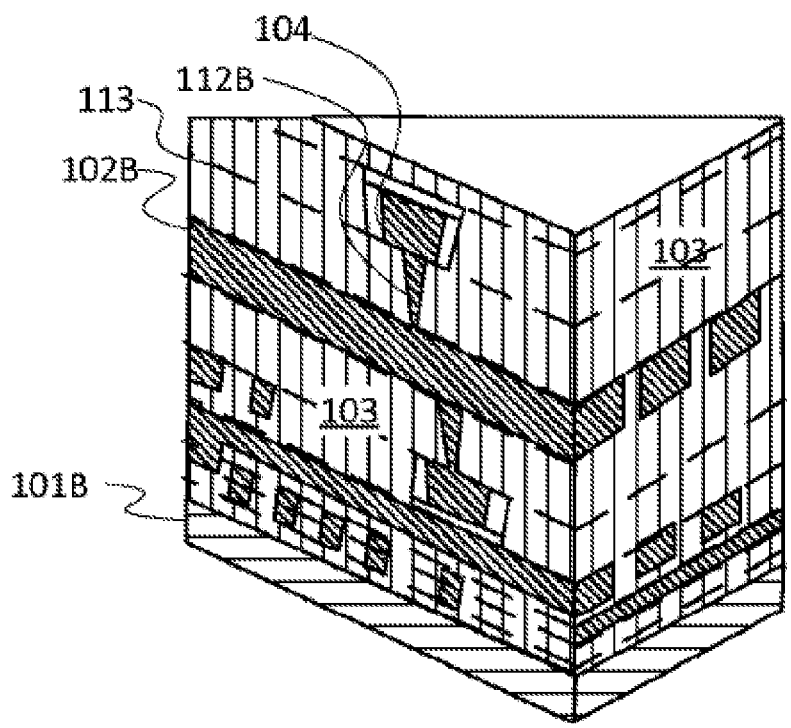

FIGS. 1A and 1B conceptually illustrate electrodes and LLD layers that can be used in superconducting circuits, but not necessarily. Particularly, FIG. 1A illustrates multiple layers of conductive structures, which may be also referred to as interconnects, without showing a LLD layer. This figure is presented simply to better visualize the three-dimensional network of electrodes 102A and vias 112A built up on substrate 101A. Substrate 101A may have other LLD layers and conductive structures below those shown. Substrate 101A may include a silicon or silicon oxide layer. In some embodiments, substrate 101A can be a part of a wafer, die, or integrated circuit.

FIG. 1B is a schematic cutaway view of several interconnect and device layers. Here, similarly to FIG. 1A, there are shown substrate 101B, such as a silicon oxide substrate, electrically conductive electrodes 102B, electrically conductive interconnects or vias 112B, all of which can be fabricated using the same methods as described above with reference to FIG. 1A. As further shown in FIG. 1B, there is provided LLD layer 103, which is disposed between different conductive structures, but within the same multiplayer stack of a superconducting circuit. According to some embodiments, the multiplayer stack may include a single LLD layer 103, but in other embodiments, there can be a plurality of LLD layers 103. Multiple LLD layers 103 can contact each other (i.e., lay over each other). For example, heavy dotted lines 113 shown in FIG. 1B delineate separately formed LLD layers 103. Alternatively, some or all LLD layers 103 can be spaced from each other or located on different levels. As described herein, each LLD layer 103 may include silicon-containing layer fabricated using one or more silane-based precursors in presence of germanium or germanium-based composition. Typically, the thickness of LLD layer 103 is in a range between about 1,000 Angstroms to about 10,000 Angstroms. In this disclosure, the term "about" shall mean a reasonable deviation of a value accompanying this term. If it is not specified otherwise, the term "about" may refer to a variation of 10% from an indicated value. In the case of a range of values, the term "about" may refer to a 10% variation from both the lower and upper limits of the range.

The illustrated structures also include electrical components 104 such as discrete or embedded transistors, capacitors, switches, resistors, resonators. In superconducting embodiments, components 104 may include Josephson junctions. In some embodiments, electrodes 102B are parts of Josephson junctions. For example, Josephson junctions may include one or more electrodes 102B interfacing with a thin dielectric layer to exhibit superconducting properties.

FIGS. 1C-1F illustrate four embodiments of superconducting circuits, such as Josephson junctions, formed using the methods described herein. The superconducting circuit may include first metal layer 102, which may be a niobium layer. In other embodiments, first metal layer 102 may include niobium nitride, niobium alloy, aluminum, aluminum nitride, aluminum alloy, titanium, titanium nitride, titanium alloy, lead, lead nitride, lead alloy, any combination thereof, or any another suitable material. In some embodiments, first metal layer 102 can be provided on a substrate such as a silicon or silicon oxide substrate, but not necessarily. Suitable methods for forming first metal layer 102 may include, but not limited to, physical vepor deposition (PVD), atomic laye deposition (ALD), CVD, pulsed layer deposition (PLD), evaporative deposition, cathodic arc deposition, thermal spray coating, sputter deposition, electroplating, photolitography, and so forth. In some embodiments, first metal layer 102 can be selectively patterned using any suitable method such as dry or wet etching.

Figure 1C:
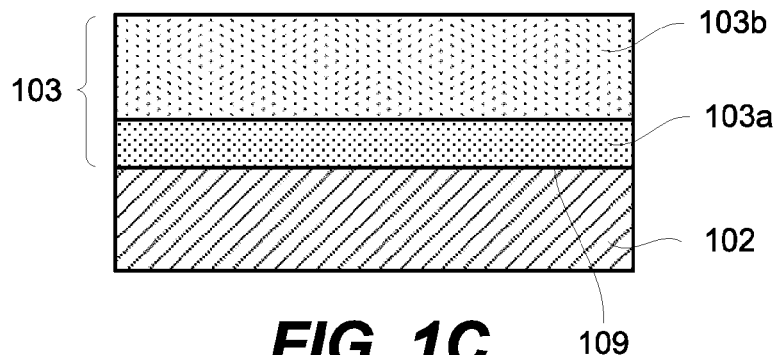

LLD layer 103 may have one or more sublayers. For example, FIG. 1C and FIG. 1E show LLD layer 103 including first sublayer 103a and second sublayer 103b. Sublayers 103a and 103b may be used to improve crystallinity of overall LLD layer 103. For example, first deposited sublayer 103a can have a high level of crystallinity and serve a template for other sublayers deposited on top of first sublayer 103a (e.g., second sublayer 103a in FIGS. 1C and 1E).

In some embodiments, each of first sublayer 103a and second sublayer 103b may include both silicon and germanium or, more specifically, polycrystalline silicon and polycrystalline germanium. The composition of first sublayer 103a and second sublayer 103b may the same or different. For example, the concentration of germanium in first sublayer 103a may greater than that in second sublayer 103b. The higher germanium concentration may be used to ensure crystallinity in first sublayer 103a, which may be formed, for example, at lower temperature than second sublayer 103b. In some embodiments, the concentration of germanium in first sublayer 103a is between about 2 and 100 times greater than in second sublayer 103b or, more specifically, between about 5 and 50 times greater. Alternatively, germanium may be present in one sublayer (e.g., first sublayer 103a) but not in another sublayer (e.g., second sublayer 103b). In other words, one of the sublayers (e.g., second sublayer 103b) may be substantially free from germanium.

The concentration of germanium in overall LLD layer 103 may be between about 5 atomic % and 50 atomic % or, more specifically, between about 10 atomic % and 25 atomic %. Alternatively, LLD layer 103 may consist essentially of polycrystalline silicon. In other words, the concentration of silicon in LLD layer 103 may be at least about 99 atomic %.

In some embodiments, LLD layer 103 also includes fluorine. Fluorine can be added before or during formation of LLD layer 103. The concentration of fluorine in LLD layer 103 may be between about 0 atomic % and 15 atomic % or, more specifically, between about 2 atomic % and 10 atomic %. Fluorine may be used to improve insulating characteristics of LLD layer 103 and/or improve methods for formation of LLD layer 103, for example, by reducing deposition temperatures.

In some embodiments, a semiconductor circuit may include a second metal layer disposed over LLD layer 103. LLD layer 103 may directly interface the second metal layer. Furthermore, as shown in FIG. 1F, LLD 103 may directly interface first metal layer 102. The second metal layer may include a metal, such as niobium and aluminum, nitrides thereof, alloys thereof, or another suitable material. The structure having two metal layers and LLD layer 103 can be also referred to Metal-Insulator-Metal (MIM) "trilayer," which can exhibit superconducting properties and form one or more Josephson junctions. In some embodiments, the interface between LLD layer 103 and first metal layer 102 is substantially free from silicide.

Figure 1D:
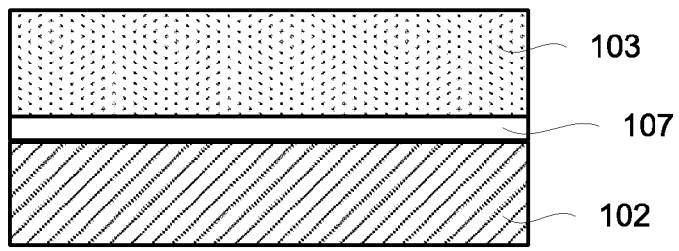
Figure 1E:
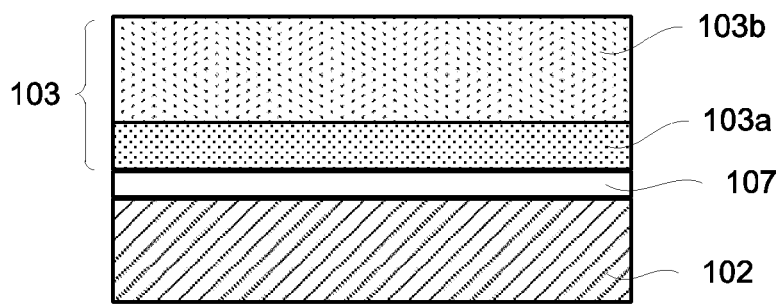
Figure 1F:
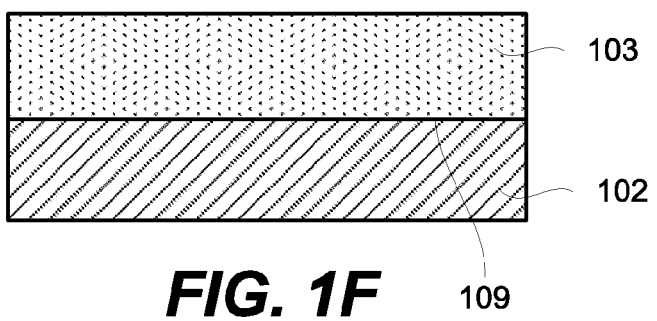

In the embodiments shown in FIG. 1D and FIG. 1E, LLD layer 103 is formed over a seed layer 107. In other words, seed layer 107 may be first formed on top of first metal layer 102. LLD layer 103 may be then formed over the top surface of seed layer 107. Accordingly, seed layer 107 may interface both first metal layer 102 and LLD layer 103 (or its sublayer). Seed layer 107 may serve as a barrier layer to reduce formation of metal silicides. Furthermore, seed layer 107 may serve as a crystallization template for forming LLD layer 103. Seed layer 107 may include one of zinc sulfide, polycrystalline germanium, and polycrystalline silicon. The selection of these materials can depend on multiple factors, such as material of first metal layer 102 and material of LLD layer 103. Seed layer 107 may be formed using different process conditions or has a different composition than LLD layer 103. The thickness of seed layer 107 may be between about 0 Angstroms and 35 Angstroms. Suitable methods for forming seed layer 107 may include, but not limited to, PVD, ALD, CVD, PLD, evaporative deposition, cathodic arc deposition, thermal spray coating, sputter deposition, and so forth. For example, seed layer 107 may be deposited using CVD at a low pressure (e.g., less than 10 Torr) to ensure the higher levels of crystallinity. This high level of crystallinity in seed layer 107 serves as a template for later deposited LLD layer 103, which may be deposited at a higher pressure thereby having a higher deposition rates. In some embodiments, the interface between LLD layer 103 and seed layer 107 is substantially free from silicide. The methods for manufacturing semiconducting circuits described herein can also ensure that LLD layer 103 and also seed layer 107, as well as first metal layer 102, are substantially free from silicide.

Examples of Forming Superconducting Circuits

Figure 2:
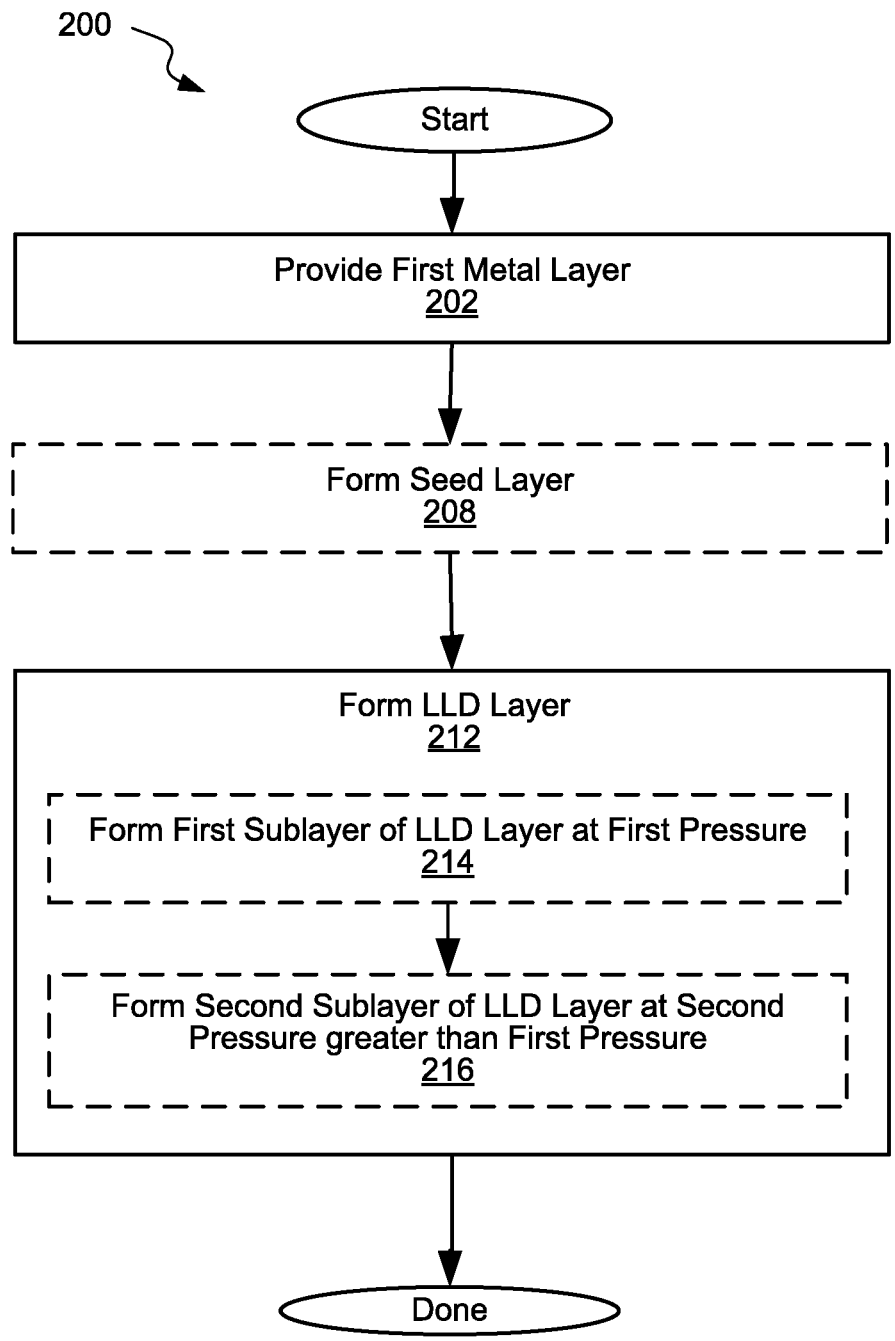
FIG. 2 is a process flowchart corresponding to a method of forming a superconducting circuit, in accordance with some embodiments.

FIG. 2 is a process flowchart corresponding to method 200 of forming a superconducting circuit, in accordance with some embodiments. Method 200 may commence with providing a first metal layer during operation 202. One example of the first metal layer is described above and shown in FIGS. 1C-1F as first metal layer 102. For example, the first metal layer may be an electrode of the superconducting circuit, such as a Josephson junction. In some embodiments, operation 202 involves forming the first metal layer using, for example, PVD. In these embodiments, operation 202 and operation 212, which is discussed below, may be performed in situ or, more specifically, without breaking vacuum in a deposition chamber that is used for both operations 202 and 212. Other methods for forming the first metal layer may also include, but not limited to, ALD, CVD, PLD, evaporative deposition, cathodic arc deposition, thermal spray coating, sputter deposition, and electroplating.

In some embodiments, method 200 involves forming a seed layer during optional operation 208. The seed layer (also referred herein to as an initial layer or protective layer) may be formed directly on the top surface of the first metal layer and prior to forming a LLD layer or its sublayers. In certain embodiments, the seed layer can directly interface with both the first metal layer and the LLD layer. One example of the seed layer includes seed layer 107 shown in FIG. 1D and FIG. 1E. Seed layer 107 may be made of zinc sulfide, polycrystalline germanium, polycrystalline silicon, or any combination thereof. Suitable methods for forming the seed layer may include, but not limited to, PVD, ALD, CVD, PLD, evaporative deposition, cathodic arc deposition, thermal spray coating, sputter deposition, and so forth. For example, the seed layer may be deposited using CVD at a pressure less than 10 Torr to ensure a high level of crystallinity, which can be served as a template for other layers such as a LLD layer.

Still referencing to FIG. 2, method 200 proceeds to operation 212, when the LLD layer formed over and directly interfacing the seed layer (if any) or the first metal layer. Some examples of LLD layers are shown in FIGS. 1C-1F as LLD layer 103. As such, the seed layer (if used) is disposed between the LLD layer and the first metal layer and, in some embodiments, directly interfaces both the LLD layer and the first metal layer as, for example, shown in FIGS. 1D and 1E and described above. The composition of the seed layer (if used) may be different from the composition of the LLD layer. The LLD layer may be formed using different process conditions or has a different composition than the seed layer. For example, a seed layer may be formed using a sputtering process (e.g., when the seed layer is formed from ZnS), while the LLD layer can be deposited using CVD process. In other embodiments, the seed layer may be formed using CVD method, but using different process parameters (e.g., different pressure, temperature, or precursors) than CVD process used for formation of the LLD layer.

The LLD layer is formed during operation 212 using, for example, CVD. However, other methods can be used such as PVD, including cathodic arc deposition, ALD, PLD, and evaporative deposition. These methods can provide sufficient control over the thickness of the deposited LLD layer. In some embodiments, CVD methods used to form the LLD layer include PECVD or thermal CVD. Without being restricted to any particular theory, it is believed that PECVD may be performed at a lower temperature than other forms of CVD and may help to reduce and even completely eliminate formation of silicides at the interface of the metal layer and the LLD. For example, during deposition of the LLD layer, the first metal layer may be kept at a temperature of less than about 525° C. or, more specifically, less than 515° C. and even less than about 500° C.

In some embodiments, forming the LLD layer is performed, at least initially, at a pressure of less than 10 Torr or even at a pressure of less than 1 Torr. For example, the pressure may be between about 0.1 Torr and 10 Torr or between about 0.1 Torr and 1 Torr. Using a low pressure during initial deposition of the LLD layer helps with forming a highly crystalline structure and serves as a template when, for example, a remainder of the LLD layer is formed at a higher pressure. Specifically, forming the LLD layer during operation 212 may involve the formation of a first sublayer at a first pressure during operation 214 and forming a second sublayer during optional operation 216 at a second pressure. The first pressure may be lower than the second pressure such as between about 2 and 10 times lower. Examples of these sublayers are shown in FIG. 1C and FIG. 1E as first LLD sublayer 103a and second LLD sublayer 103b. Specifically, first LLD sublayer 103a can be formed directly over the first metal layer, such as first metal layer 102, at the first pressure maintained inside the deposition chamber (e.g., between about 0.1 Torr and 1 Torr). Next, second LLD sublayer 103b is formed directly over first LLD sublayer 103a at the second pressure, which is higher than the first pressure in at least 2-10 times (e.g., between about 1 Torr and 10 Torr).

After formation of the LLD layer during operation 212, method 200 may optionally include operations for forming a second metal layer. In some embodiments, the material of the second metal layer is the same as the material of the first metal layer. In other embodiments, the material of the first metal layer differs from the material of the second metal layer. The second metal layer is formed using at least one the following processes: PVD, ALD, CVD, PLD, evaporative deposition, cathodic arc deposition, thermal spray coating, sputter deposition, electroplating, and so forth.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of forming a superconducting circuit, the method comprising:
   providing a metal layer,
      wherein the metal layer is a part of a Josephson junction; and
   forming a low loss dielectric (LLD) layer over the metal layer using chemical vapor deposition (CVD),
      wherein the metal layer is kept at a temperature of less than about 525° C. while forming the low loss dielectric layer, and
      wherein the low loss dielectric layer comprises at least one of polycrystalline silicon or polycrystalline germanium.

2. The method of claim 1, wherein the low loss dielectric layer comprises both polycrystalline silicon and polycrystalline germanium.

3. The method of claim 2, wherein a concentration of polycrystalline germanium in the low loss dielectric layer is between about 5 atomic % and 50 atomic %.

4. The method of claim 2, wherein a concentration of polycrystalline germanium in the low loss dielectric layer is between about 10 atomic % and 25 atomic %.

5. The method of claim 1, wherein the low loss dielectric layer consists essentially of polycrystalline silicon.

6. The method of claim 1, wherein forming the low loss dielectric layer is performed at pressure of less than 10 Torr.

7. The method of claim 1, wherein forming the low loss dielectric layer is performed at a pressure of less than 1 Torr.

8. The method of claim 1, further comprising, prior to forming the low loss dielectric layer, forming a seed layer over the metal layer, wherein the low loss dielectric layer is formed over and directly interfacing the seed layer.

9. The method of claim 8, wherein the seed layer comprises one of ZnS, polycrystalline germanium, or polycrystalline silicon.

10. The method of claim 8, wherein the seed layer is formed using different process conditions or has a different composition than the low loss dielectric layer.

11. The method of claim 1, wherein an interface between the low loss dielectric layer and the metal layer is substantially free from silicide.

12. The method of claim 11, wherein the metal layer comprises niobium.

13. The method of claim 1, wherein chemical vapor deposition used to form the low loss dielectric layer is plasma enhanced chemical vapor deposition (PECVD).

14. The method of claim 1, wherein chemical vapor deposition used to form the low loss dielectric layer is thermal chemical vapor deposition.

15. The method of claim 1, wherein the low loss dielectric layer further comprises fluorine.

* * * * *